United States Patent [19]

Suaréz et al.

[11] Patent Number: 4,559,505
[45] Date of Patent: Dec. 17, 1985

[54] FREQUENCY SYNTHESIZER WITH IMPROVED PRIORITY CHANNEL SWITCHING

[75] Inventors: José I. Suaréz, Miami; James S. Irwin, Ft. Lauderdale; Wayne P. Shepherd, Sunrise, all of Fla.

[73] Assignee: Motorola, Inc., Schaumburg, Ill.

[21] Appl. No.: 455,454

[22] Filed: Jan. 4, 1983

[51] Int. Cl.$^4$ .............................................. H03L 7/00
[52] U.S. Cl. ..................... 331/1 A; 331/17; 331/25
[58] Field of Search .................. 331/1 A, 14, 17, 25; 332/19

[56] References Cited

U.S. PATENT DOCUMENTS

| | | |
|---|---|---|
| 3,341,696 | 9/1967 | Thaulow . |
| 3,581,300 | 7/1968 | Eloranta . |
| 3,617,895 | 11/1971 | Tomsa . |
| 3,729,688 | 4/1973 | Cerny, Jr. et al. ............... 331/25 X |
| 3,750,032 | 7/1973 | Andrews . |
| 4,061,979 | 12/1977 | Walker et al. ..................... 331/17 X |
| 4,117,420 | 9/1978 | De Coninck et al. ............... 331/17 |
| 4,185,246 | 1/1980 | Schroeder . |
| 4,190,803 | 2/1980 | Imamura . |
| 4,243,941 | 1/1981 | Zdunek ............................ 331/17 X |
| 4,330,758 | 5/1982 | Swisher et al. ................... 331/17 X |

FOREIGN PATENT DOCUMENTS

| | | | |
|---|---|---|---|
| 24516 | 2/1979 | Japan ........................... 331/17 |
| 55351 | 5/1979 | Japan ........................... 331/17 |
| 67242 | 5/1980 | Japan ........................... 331/17 |
| 80932 | 7/1981 | Japan ........................... 331/17 |

OTHER PUBLICATIONS

Rhodes, R. et al., "Frequency Agile Phase-Locked Loop Synthesizer for a Communications Satellite", NTC '80, Houston, Tex., Nov. 3,–Dec. 4, 1980.
IEEE National Telecommunications Conference, 1980, pp. 22.3.1–22.3.6.
Josefsberg, Y., "Stable and Fast PLL Switches Loop Bandwidths", Electronics, Mar. 10, 1982, p. 139.

*Primary Examiner*—Eugene R. LaRoche
*Assistant Examiner*—Robert J. Pascal
*Attorney, Agent, or Firm*—Daniel K. Nichols; Mark P. Kahler; Joseph T. Downey

[57] ABSTRACT

A frequency synthesizer is provided including a reference frequency generator coupled to one input of a phase detector. The output of the phase detector is coupled via a pair of alternatingly connected filters through a voltage controlled oscillator and a divider circuit to the remaining input of the phase detector to form a phase locked loop. The first filter of the pair is designated for operation on a main channel frequency while the remaining filter is designated for operation on a priority channel frequency. The capacitive elements of each respective filter remain fully charged up for operation on their respective frequencies and thus when such filters are alternately switched between to change frequency from the main channel to the priority channel, the capacitive elements need not be charged to new levels to accommodate such frequency change. Thus, switching between a main channel and a priority channel is accomplished in a minimal amount of time with a significant reduction in frequency synthesizer energy requirements.

5 Claims, 12 Drawing Figures

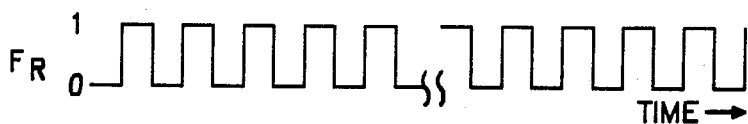
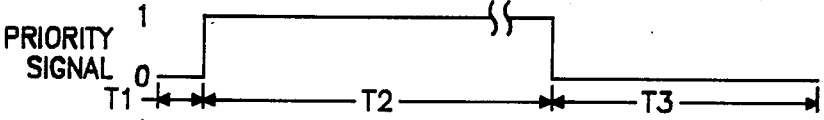
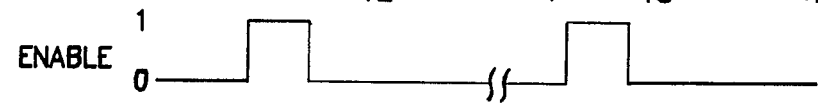
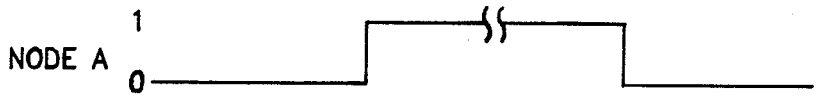
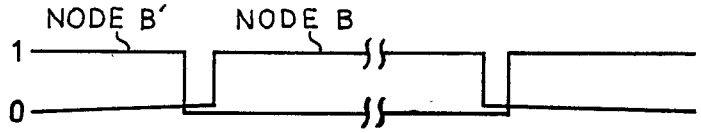

FREQUENCY SYNTHESIZER WITH IMPROVED PRIORITY CHANNEL SWITCHING

BACKGROUND OF THE INVENTION

This invention relates to frequency synthesizer circuits and, more particularly to frequency synthesizer circuits having priority channel monitoring capabilities.

DESCRIPTION OF THE PRIOR ART

A conventional frequency synthesizer circuit employing known phase lock loop technology is shown in FIG. 1. More specifically, the synthesizer of FIG. 1 includes a reference oscillator 1 having an output frequency of 4.5 MHz, for example. The output of oscillator 1 is coupled to one input 2A of a phase detector 2 having inputs 2A and 2B. The 4.5 MHz signal applied to phase detector input 2A by reference oscillator 1 is designated $V_{REF}$.

The synthesizer of FIG. 1 includes a voltage controlled oscillator (VCO) 3 which operates at a frequency which is adjustably varied by an error voltage signal provided to an input thereof. For purposes of this example, it is assumed that voltage controlled oscillator 3 generates an output signal $V_{VCO}$ at a nominal frequency of approximately 450 MHz.

The output of oscillator 3 is coupled to the input of a programmable divider 4 via a coupler 5 as shown in FIG. 1. Divider 4 is initially programmed to divide by 100 such that the 450 MHz $V_{VCO}$ signal provided to divider 4 is divided by 100 to generate a $V_{DVCO}$ signal having a frequency of 4.5 MHz at the output of divider 4. The output of divider 4 is coupled to phase detector input 2B such that the frequency of the $V_{REF}$ signal and the frequency of the $V_{DVCO}$ signal are compared. If there is any frequency or phase difference between these two signals, phase detector 2 generates an output error signal which is coupled to oscillator 3 via a low pass filter 6. Such error signal generated by phase detector 2 causes oscillator 3 to change frequency until the $V_{DVCO}$ and $V_{REF}$ signals at the phase detector inputs are equal in frequency and phase. Low pass filter 6 is typically comprised of a resistor-capacitor network which provides sufficient damping to the error signal generated by phase detector 2 to prevent voltage controlled oscillator 3 from overshooting.

From the above discussion, it is seen how the frequency synthesizer of FIG. 1 generates or synthesizes a radio frequency output signal exhibiting one predetermined frequency, namely 450 MHz, for example. However, the synthesizer is advantageously employed to generate radio frequency output signals exhibiting other preselected frequencies. For example, to generate a radio frequency output signal having a frequency of 454.5 MHz, divider 4 is programmed to divide the VCO output signal $V_{VCO}$ by 101 to generate a divided down signal $V_{DVCO}$ exhibiting a frequency of 4.5 MHz. Phase detector 2 then compares the frequency of the $V_{REF}$ signal and the $V_{DVCO}$ signal and generates an error voltage signal which passes through filter 6 to appropriately correct the frequency of oscillator 3 to the new desired frequency of the radio frequency output signal.

Similarly, to change the frequency of the radio frequency output signal to a new value of 459 MHz, divider 4 is programmed to divide by 102. Thus, various frequencies may be synthesized at spacing increments of 4.5 MHz, that is, the frequency of the $V_{REF}$ signal. It is noted that each time divider 4 is reprogrammed to cause a different radio frequency output signal to be generated, a different phase error signal is generated by phase detector 2 to drive VCO 3 to the new desired frequency. Each time such new phase error signals are generated due to frequency selection programming changes of divider 4, the capacitive elements in filter 6 must be charged to new levels corresponding to the new desired frequency. Thus, each time a frequency change is to be implemented, significant quantities of energy are consumed by filter 6.

Frequency synthesizers are highly desirable in modern portable radio devices. A synthesizer allows a radio user to select one of a relatively large number of predetermined operating frequencies. Advantageously, only one reference crystal is employed in the synthesizer circuit of FIG. 1 to generate a large number of different operating frequencies, whereas in the past a separate crystal was required for each different transmitting and receiving frequency to be employed.

Further, in modern portable handheld radio devices, it is often desirable to have the synthesized radio monitor a main channel frequency most of the time but periodically switch, in the shortest time possible, to a second channel frequency (priority channel) to determine if such channel is active. The synthesizer in such a radio is thus caused to switch between the main channel and the priority channel at a predetermined rate of four times per second, for example. Unfortunately, when a frequency synthesizer such as that shown in FIG. 1 is caused to periodically shift between a main channel and a priority channel, the capacitive elements in low pass filter 6 must recharge to new levels each time a frequency shift is caused. Such recharging typically does not occur fast enough to prevent loss of information when switching between the main channel and the priority channel. Time is lost waiting for the VCO frequency to stabilize. This recurrent recharging of the low pass filter 6 also can result in a significant amount of battery drain which is an important operating constraint in portable hand-held radio devices.

It is one object of the present invention to provide a frequency synthesizer which transitions between a main channel and a priority channel and vice versa in a minimum amount of time.

It is one object of the present invention to provide a frequency synthesizer circuit capable of main channel and priority channel operation without repeated low pass loop filter charging during frequency shifting between the main channel and the priority channel.

Another object of the present invention, is to provide a frequency synthesizer circuit which exhibits reduced energy requirements.

These and other objects of the invention will become apparent to those skilled in the art upon consideration of the following description of the invention.

BRIEF SUMMARY OF THE INVENTION

The present invention is directed to providing a frequency synthesizer circuit capable of switching between a main channel and a priority channel in a minimal amount of time while maintaining minimal current consumption.

In accordance with one embodiment of the invention, the frequency synthesizer circuit includes a reference frequency generator for generating a reference signal exhibiting a predetermined frequency $F_R$.

A tri-state phase detector includes first and second inputs with the first input being coupled to the output of the frequency generator. The phase detector generates a signal exhibiting indicia of the difference in frequency and phase between signals applied to the first and second inputs thereof.

A first low pass filter is switchably coupled to the output of the phase detector. A second low pass filter is coupled to the output of the phase detector. A voltage controlled oscillator is switchably coupled to the respective outputs of the first and second low pass filters. Such voltage controlled oscillator generates a radio frequency signal at the output thereof which exhibits a frequency which is a function of the voltage applied at the input thereof. The synthesizer includes a frequency divider having an input coupled to the output of the oscillator. The frequency divider divides the signal generated at the output of the oscillator by a predetermined quantity to generate a divided down signal $F_V$ which is provided to the second input of the phase detector.

The frequency synthesizer of the present invention includes a switching circuit which is responsive to a timing signal. The switching circuit is coupled to the first and second filters. Further, the switching circuit is operative in a first mode to couple the first filter between the output of the phase detector and the input of the oscillator. The switching circuit is operative in a second mode to couple the second filter between the output of the phase detector and the input of the oscillator. A timing signal generator is coupled to the switching circuit for generating a timing signal which instructs the switching circuit to switch between the first and second modes at preselected points in time when pulses of the $F_R$ signal and the $F_V$ signal substantially coincide in time at the first and second inputs of the phase detector.

The features of the invention believed to be novel are set forth with particularity in the appended claims. The invention itself, however, both as to organization and method of operation, together with further objects and advantages thereof, may best be understood by reference to the following description taken in conjunction with the accompanying drawings.

DESCRIPTION OF THE DRAWINGS

FIGS. 3a, 3b, 3c, 3d, 3e, 3f, 3g, 3h, and 3i are timing diagrams which indicate the logic state at various points in the timing circuit portion of the frequency synthesizer of the present invention.

FIG. 4 is an exploded view of the timing diagram of FIG. 3d superimposed on the timing diagram of FIG. 3a.

DETAILED DESCRIPTION OF THE PREFERRED EMBODIMENT

Figure 1:
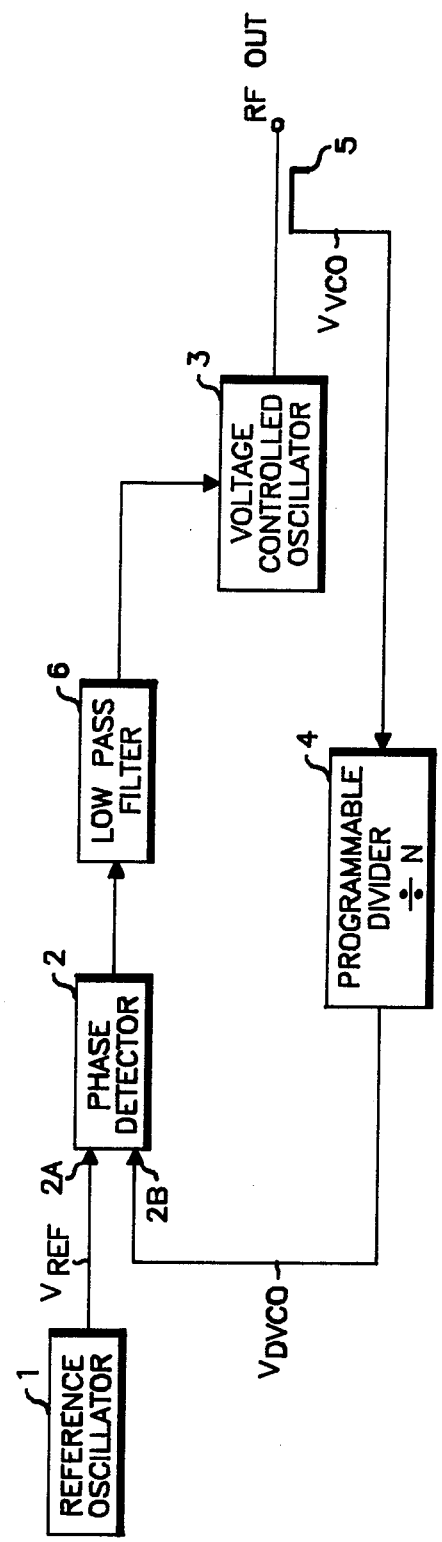
FIG. 1 is a block diagram of a conventional frequency synthesizer circuit.
Figure 2:
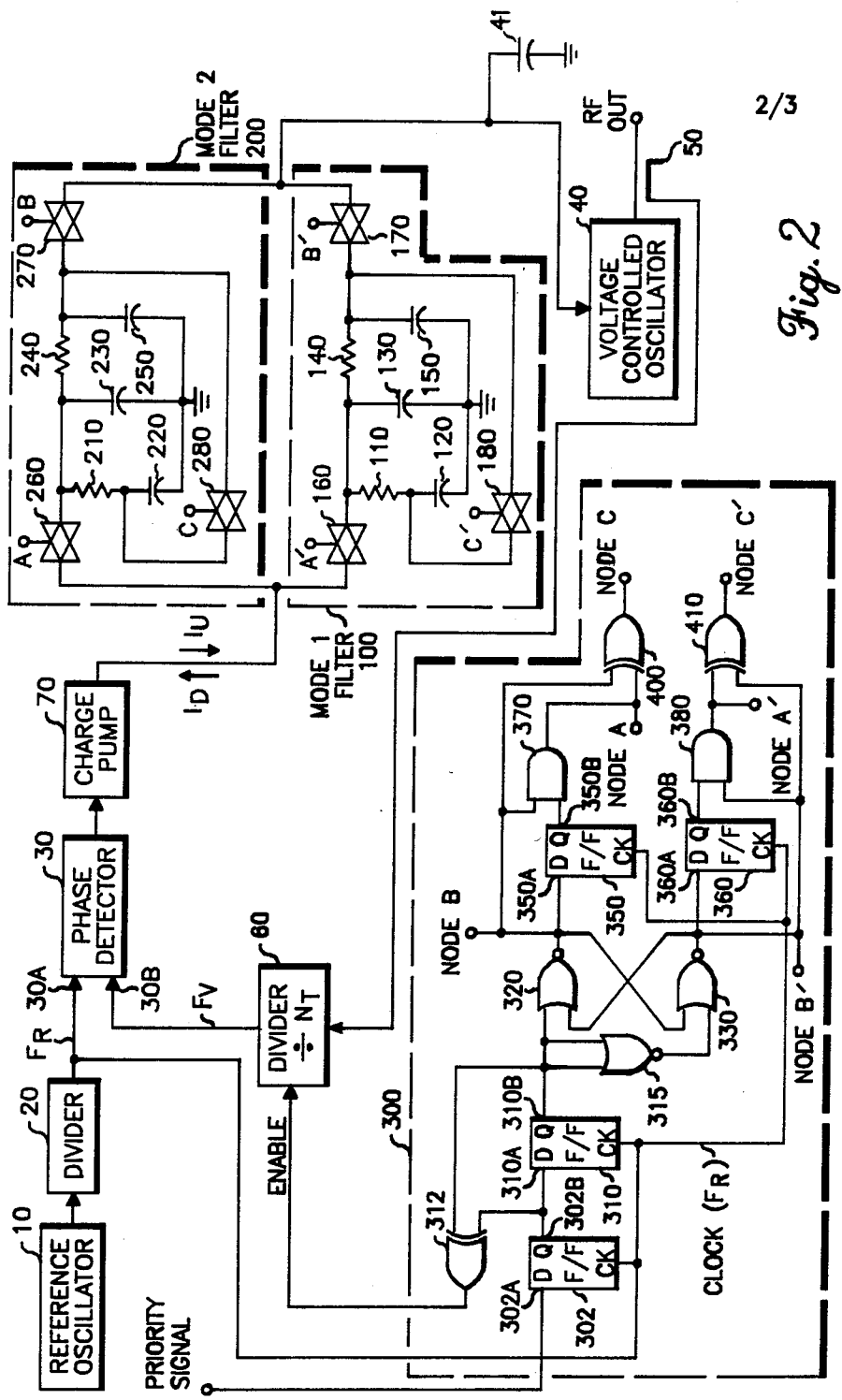
FIG. 2 is a representation of the frequency synthesizer circuit of the present invention.

FIG. 2 illustrates one embodiment of the frequency synthesizer circuit of the present invention. The synthesizer circuit of FIG. 2 includes a reference oscillator 10 which generates a signal exhibiting a frequency of 2100 KHz at its output. The output of reference oscillator 10 is coupled to the input of a divider circuit 20. Divider circuit 20 divides the 2100 KHz signal provided thereto by the number 420. Thus, divider circuit 20 generates a signal designated $F_R$ exhibiting a frequency of 5 KHz at the output of divider 20.

The output of divider 20 is coupled to an input 30A of a tri-state phase detector 30 having inputs 30A and 30B. Phase detector 30 generates an error signal at its output which exhibits indicia of the difference in frequency and phase between signals applied to inputs 30A and 30B. One phase detector which may be employed as tri-state phase detector 30 is the phase detector included in the synthesizer integrated circuit Model No. MC145156 manufactured by Motorola Inc.

The output of phase detector 30 is coupled to the input of a charge pump 70. The output of charge pump 70 is coupled to filter circuits 100 and 200 in the manner shown in FIG. 2. Charge pump 70 causes a current $I_U$ to be pumped into a selected one of filters 100 and 200 when the error signal generated by phase detector 30 indicates that the $F_R$ signal at input 30A exhibits a frequency greater than the frequency of the signal applied at 30B. The signal applied to phase detector input 30B is described in more detail subsequently. Charge pump 70 draws a current $I_D$ from a selected one of filters 100 and 200 when the error signal generated by phase detector 30 indicates that the frequency of the signal applied to input 30B is greater than the frequency of $F_R$ signal applied to input 30A.

The value of the $I_U$ current is dependent upon the extent which the frequency of the $F_R$ signal at input 30A exceeds the frequency of the signal at input 30B. The $I_D$ value is dependent upon the extent which the frequency of the signal at input 30B exceeds the frequency of the $F_R$ signal at input 30A at various points of time while the synthesizer of FIG. 2 is in operation.

The output of charge pump 70 is switchably coupled to the respective inputs of low pass filter networks 100 and 200 in the manner shown in FIG. 2 and described in more detail subsequently. The output of filter networks 100 and 200 are respectively switchably coupled to the input of a voltage controlled oscillator (VCO) 40 in the manner shown in FIG. 2. A storage (bypass) capacitor 41 is shown coupled from the input of VCO 40 to ground. Capacitor 41 represents the capacitance typically associated with the varactor of one VCO which may be employed as VCO 40 in the present invention.

Low pass filter 100 includes a resistor 110 and a capacitor 120 coupled together in series to provide the main filter action of filter 100. Capacitor 120 typically exhibits the largest capacitance value of any of the capacitors in filter 100. For example, capacitor 120 exhibits a capacitance of 1 microfarad in one embodiment of the invention. The terminal of capacitor 120 which is not coupled to resistor 110 is coupled to ground. A capacitor 130 is coupled in parallel with the resistor 110- capacitor 120 combination. A resistor 140 is coupled in series with a capacitor 150. The combination formed by resistor 140 and capacitor 150 is together coupled in parallel with capacitor 130.

A transmission gate 160 is coupled between the output of charge pump 70 and the node at which resistors 110 and 140 are connected together. Thus, the input of filter 100 is switchably coupled to the output of charge pump 70. A transmission gate 170 is coupled between the input of VCO 40 and the node formed between resistor 140 and capacitor 150. Thus, the output of filter 100 is switchably coupled to the input of VCO 40. Transmission gates 160 and 170 respectively include control terminals A' and B' which activate the transmission gates to a turned-on state when an appropriate logic signal is applied thereto. Thus, when appropriate logic signals are applied to control terminals A' and B' of gates 160 and 170, respectively, the gates turn on to couple filter 100 between the output of charge pump 70 and the input of oscillator 40. When filter 100 is so coupled, the frequency synthesizer of FIG. 2 is defined to be operating in a first mode (Mode 1). In Mode 1 operation all capacitors in filter 100 are charged to appropriate respective voltages for VCO operation on the main channel frequency.

A transmission gate 180 including a control terminal C' is coupled between the node formed between resistor 110 and capacitor 120 and the node formed by the junction of resistor 140 and capacitor 150. The transmission gates 160, 170 and 180 are turned on at appropriate times determined by timing circuit 300 which supplies timing signals to the respective gates. Timing circuit 300 is described later in full detail. Mode 1 filter 100 is defined to be operating in a first mode when timing circuit 300 applies appropriate logic signals to control terminals A', B', and C' of filter 100 to connect filter 100 between the output of charge pump 70 and the input of voltage control oscillator 40 for a selected period of time.

The frequency synthesizer of FIG. 2 includes a Mode 2 filter 200 which is substantially identical to Mode 1 filter 100 and is coupled in parallel therewith. More specifically, resistor 210, capacitor 220, capacitor 230, resistor 240, capacitor 250 of Mode 2 filter 200 correspond in structure and configuration to resistor 110, capacitor 120, capacitor 130, resistor 140 and capacitor 150 of Mode 1 filter 100. Mode 2 filter 200 further includes transmission gates 260, 270 and 280 which correspond in structure and configuration to transmission gates 160, 170 and 180, respectively of Mode 1 filter 100. Transmission gates 260, 270 and 280 respectively include control terminals A, B, and C which actuate the respective gates when appropriate logic signals from timing circuit 300 are provided thereto. In Mode 2 operation, all capacitors in filter 200 are charged to appropriate respective voltages for VCO operation on the priority channel frequency.

Timing circuit 300, in response to the priority signal shown in FIG. 3b, alternatingly generates logic signals which causes transmission gates 160, 170, and 180 to appropriately couple Mode 1 filter 100 between charge pump 70 and VCO 40 so that VCO 40 operates for a predetermined amount of time, 240 msec for example, on a selected main channel frequency of approximately 450 MHz, for example and then generates logic signals to appropriately energize gates 260, 270 and 280 to couple Mode 2 filter 200 between the output of charge pump 70 and the input of VCO 40 so that VCO 40 operates for a predetermined amount of time, 10 msec for example, on a priority channel of second selected frequency of approximately 450.005 MHz, for example. The former conditions wherein VCO 40 operates on the main channel frequency constitutes Mode 1 operation. The latter conditions wherein VCO 40 operates on the priority channel frequency constitutes Mode 2 operation.

Although described in more detail subsequently, timing signal generating circuit 300 generates the aforementioned timing signals supplied to gates 160, 170, 180, 260, 270, and 280 in a manner so that whenever Mode 1 filter 100 is coupled between charge pump 70 and VCO 40, Mode 2 filter 200 is disconnected therefrom and vice versa. More specifically, whenever filter 100 is activated to commence Mode 1 operation, the sequence of signals generated by timing signal generator 300 is such that transmission gate 170 turns on first. Thereafter, gate 180 turns on momentarily to ensure fast recharging of the relative small capacitor 41 to the appropriate voltage value for Mode 1 main channel frequency operation. Lastly, gate 160 is turned on so that filter 100 is finally coupled between charge pump 70 and VCO 40 for normal Mode 1 filtering action. Correspondingly, whenever filter 200 is activated to Mode 2 operation, the sequence of signals generated by timing signal generator 300 is such that transmission gate 270 turns on first. Thereafter, gate 280 turns on momentarily to ensure fast recharging of capacitor 41 to the appropriate voltage value for Mode 2 priority channel operation. Lastly, gate 260 is turned on so that filter 200 is finally coupled between charge pump 70 and VCO 40 for normal Mode 2 filtering action.

In the first mode the synthesizer is operating on the main channel frequency. After the synthesizer has operated at the main channel frequency for a predetermined amount of time, timing signal generating circuit 300 generates appropriate timing signals to cause the aforementioned transmission gates to disconnect Mode 1 filter 100 and to connect in its place Mode 2 filter 200 between the output of charge pump 70 and the input VCO 40. VCO 40 thus commences operation on the priority channel.

The output of VCO 40 is coupled via a coupler 50 to the input of a programmable divider circuit 60. Divider circuit 60 divides the frequency of the coupled output signal from the VCO output by a selected quantity $N_T$. In this embodiment divider circuit 60 is appropriately programmed such that $N_T$ equals 90,000 for the main channel frequency of 450 MHz and 90,001 for the priority channel frequency of 450.005 MHz, for example. Thus, the 450 MHz VCO output signal is divided by 90,000 to generate a signal $F_V$ exhibiting a frequency of approximately 5 KHz at the output of divider 60. The output of divider 60 is coupled to the input 30B of phase detector 30, such that, the $F_V$ signal is provided thereto for phase and frequency comparison purposes with respect to the $F_R$ signal provided to phase detector input 30A. A dual modulus prescaler type divider is employed as divider 60 in the embodiment of the invention shown in FIG. 2.

Timing signal generator 300 generates appropriate logic timing signals at nodes A, B, C, A', B', and C' thereof to cause the aforementioned switching between Mode 1 filter 100 and Mode 2 filter 200 to occur at points in time when pulses of the $F_R$ signal and pulses of the $F_V$ signal substantially coincide in time at phase detector inputs 30A and 30B, respectively. The logic timing signals generated at the aforementioned nodes of timing signal generator 300 are shown in the timing diagrams of FIGS. 3d–3i. Switching the synthesizer of FIG. 2 between the main channel frequency and the priority channel frequency in this manner results in minimization of switching time between such channels. It is understood that the particular timing signal generator shown in FIG. 2 is an example of just one timing generator that may be conveniently employed as generator 300. Other timing generators may be employed as generator 300 provided that the generators are capable of generating the timing signals shown in FIGS. 3c–3i.

FIG. 3a is a timing diagram of the $F_R$ frequency reference signal generated by reference oscillator 10 in combination with divider 20. The output of divider 20 is coupled to the clock input 302A of a D flip-flop 302 to provide a clock signal thereto.

FIG. 3b is a timing diagram of the priority signal which exhibits a logic level of 0 for a predetermined period of time during which the synthesizer of FIG. 2 operates in the first mode wherein Mode 1 filter 100 is energized to cause VCO 40 to generate an output signal exhibiting the frequency of the main channel. The priority signal of FIG. 3b assumes a logic level of 1 to cause Mode 2 filter circuit 200 to be energized to cause VCO 40 to operate on the frequency of the priority channel. The priority signal of FIG. 3b is provided to input 302A of D flip-flop 302. The duration of time during which the priority signal assumes a logic level of 0 and a logic level of 1 are selected according to the the amount of time it is desired for the synthesizer to generate an output signal at the main channel frequency and the priority channel frequency, respectively. Further, the priority signal controls the rate of switching between the main channel and the priority channel. Output 302B of the D flip-flop 302 is connected to the input 310A of D flip-flop 310. D flip-flop 310 includes a clock input which is coupled to the clock input of the flip-flop 302 such that the $F_R$ reference frequency signal is provided thereto. Flip-flop input 310A is coupled to one input of a two input exclusive OR gate 312. The remaining input of exclusive OR gate 312 is coupled to the output 310B of D flip-flop 310. The output of exclusive OR gate 312 is operatively coupled to the enable input of divider 60 to permit divider 60 to be programmed by selected quantities $N_T$, already discussed.

The output 310B of D flip-flop 310 is coupled to both inputs of a two input NOR gate 315. Both inputs of NOR gate 315 are coupled to one input of a two input NOR gate 320. The remaining input of NOR gate 320 is coupled to the output of a two input NOR gate 330. The output of NOR gate 320 is coupled to one input of NOR gate 330. The remaining input of NOR gate 330 is coupled to the output of NOR gate 315. NOR gates 315, 320 and 330 act together to constitute a non-overlap circuit which prevents Mode 2 filter 200 from being turned on before Mode 1 filter 100 is turned off. This non-overlap circuit further prevents Mode 1 filter circuit 100 from being turned on before Mode 2 filter 200 is turned off. To accomplish this, the output of NOR gate 330 is designated node B'. Node B' is coupled to the B' control terminal of transmission gate 170 of Mode 1 filter 100. The output of NOR gate 320 is designated Node B. Node B is coupled to the B terminal of transmission gate 270 of Mode 2 filter 200. The non-overlap circuit controls the time at which transmission gates 170 and 270 are turned on and off to prevent overlap in the times which Mode 1 filter 100 and Mode 2 filter 200 are coupled into the main synthesizer loop formed by phase detector 30, charge pump 70, Mode 1 filter 100, Mode 2 filter 200, VCO 40 and divider 60.

Node B is coupled to the input 350A of a flip-flop 350, to one input of a two input AND gate 370 and to one input of a two input exclusive OR gate 400. The output of flip-flop 350 is coupled to the remaining input of AND gate 370. The output of AND gate 370 is coupled to the remaining input of exclusive OR gate 400 and constitutes a node designated Node A. Node A of timing signal generator 300 is coupled to the control terminal A of transmission gate 260. The output of exclusive OR gate 400 is designated Node C and is coupled to the C control terminal of transmission gate 280.

Node B' of timing signal generator 300 is coupled to an input 360A of flip-flop circuit 360. The clock input of flip-flop 360 is coupled to the clock input of flip-flop 350 and to the clock input of D-flip-flop 302 so that the $F_R$ reference signal is provided to such clock inputs. Node B' is coupled to one input of a two input AND gate 380 and to one input of a two input exclusive OR gate 410. The output 360B of flip-flop 360 is coupled to the remaining input of AND gate 380. The output of AND gate 380 is coupled to the remaining input of exclusive OR gate 410 and is designated Node A'. Node A' is coupled to the A' control terminal of transmission gate 160. The output of exclusive OR gate 410 is designated Node C'. Node C' is coupled to the C' control terminal of transmission gate 180.

To further understand the operation of this embodiment of the synthesizer of the present invention, it is instructive to examine the logic timing signals generated by timing signal generator 300 as depicted in FIGS. 3c–3i. Principally, these logic timing signals control the sequence in which the transmission gates of Mode 1 filter 100 and Mode 2 filter 200 are actuated. The synthesizer is now examined under conditions where Mode 1 filter 100 and Mode 2 filter 200 have assumed a steady state condition, that is, the respective capacitive elements thereof are substantially fully charged. More specifically, the capacitors of Mode 1 filter 100 are charged to a value appropriate for the main channel frequency generated by VCO 40 as instructed by the corresponding $N_T$ divider value selected for divider circuit 60 for such frequency. In a similar manner, the capacitive elements of Mode filter 200 assume steady state voltage levels appropriate for causing VCO 40 to generate an output signal exhibiting the priority channel frequency as determined by the particular $N_T$ divider value programmed into divider 60 for such priority channel frequency.

It is noted that D flip-flop 302 is employed to synchronize the priority signal shown in FIG. 3b with the $F_R$ reference clock signal shown in FIG. 3a. D flip-flop 310 and exclusive OR gate 312 operate to generate an enable signal shown in FIG. 3c which instructs divider circuit 60 as to the appropriate times to switch from the value of $N_T$ appropriate for the main channel and the value $N_T$ appropriate for the priority channel.

It is assumed that the aforementioned steady state condition of substantially fully charged capacitive elements in both Mode 1 filter 100 and Mode 2 filter 200 has been achieved and that the priority signal exhibits a 0 logic state such that the synthesizer has stabilized in Mode 1 operation. That is, Mode 1 filter 100 has been appropriately coupled to the output of charge pump 70 and the input of VCO 40 by transmission gates 150 and 170, respectively and divider 60 has been enabled to divide by an appropriate $N_T$ value to cause VCO 40 to generate an output signal on the main channel frequency. Under these steady state Mode 1 conditions, the priority signal exhibits a logic zero state as shown in the relatively small T1 time interval of FIG. 3b which reflects the state of the priority signal near the end of a period of Mode 1 operation immediately before the priority signal changes to a 1 logic state indicating to the synthesizer that Mode 2 operation is to be inititated.

Examining the portions of the subsequent FIGS. 3c–3f immediately below the T1 time interval of FIG. 3b in which steady state Mode 1 operation is indicated, it is seen that in FIG. 3c the enable signal exhibits a logical zero state indicating selection by divider 60 of the $N_T$ appropriate for Mode 1 main channel frequency operation. Further, examining the portions of FIGS. 3d, 3e, and 3f immediately below the T1 time interval of FIG. 3b it is seen that during the end of Mode 1 operation, Nodes B, C and A exhibit logical zero states, respectively. Thus, during steady state Mode 1, operation, transmission gates 260, 270 and 280 are in a turned off state so that Mode 2 filter 200 is disconnected from the main synthesizer loop.

Examining the portions of FIGS. 3g–3i immediately below the T1 time interval of FIG. 3b it is seen that in Mode 1 steady state operation, nodes B', C' and A' of timing signal generator 300 exhibit logic states of one, zero and one, respectively. Thus, in steady state Mode 1 operation, transmission gates 160 and 170 are turned on to couple Mode 1 filter 100 between the output charge pump 70 and the input of VCO 40 in the main synthesizer loop. In the steady state Mode 1 operation, transmission gate 180 is turned off so that the main filter portion formed by resistor 110 and 120 provides appropriate filtering action.

In Mode 1 steady state, the following circuit actions occur. Outputs 302B and 310B of flip-flops circuits 302 and 310, respectively have assumed a logic state of 0. The logic state of 0 at flip-flop output 310B causes the output of NOR gate 320 (Node B) to exhibit a 0 logic state and the output of NOR gate 330 (Node B') to exhibit a 1 logic state in steady state Mode 1 operation. Output 350B of flip-flop 350 assumes a 0 output state which causes the outputs of NAND gate 370 (Node A) and exclusive OR gate 400 (Node C) to assume logical 0 output states so that Nodes A, B, and C exhibit the aforementioned logic output states in Mode 1 steady state. Flip-flop output 360B assumes a logical 1 state such that the output of NAND gate 380 (Node A') assumes a logical 1 state and the output of exclusive OR gate 410 assumes a logical 0 state. Thus, Nodes A', B' and C' assume the aforementioned logic states in steady state Mode 1.

Referring again to FIG. 3b, it is seen that a the beginning of the time interval designated T2 the priority signal changes from a logical 0 state to a logical 1 state indicating that the synthesizer should change frequencies from the main channel frequency to the priority channel frequency momentarily. That is, this logic level change at the beginning of the T2 timed interval indicates that Mode 1 operation of the synthesizer should cease and Mode 2 operation should commence. This is accomplished by turning off transmission gates 160, 170 and 180 of Mode 1 filter 100 at appropriate times to effectively disconnect filter 100 from the main synthesizer loop. Moreover, to commence Mode 2 operation on the priority channel frequency, transmission gates 260, 270 and 280 of Mode 2 filter 200 are turned on in appropriate sequence thus initiating Mode 2 operation as subsequently discussed.

As seen in FIG. 3c, the transition of the priority signal from a logical 0 to a logical 1 at the beginning of T2 time interval is synchronized to the $F_R$ reference signal of FIG. 3a by action of flip-flop 302, flip-flop 310 and exclusive OR gate 312 which cooperate to generate an enable signal at the input of divider 60 to instruct divider 60 to switch from the $N_T$ value appropriate for Mode 1 main channel operation to the $N_T$ value appropriate for priority channel frequency operation.

Examining the portions of FIGS. 3g–3i below and corresponding to the T2 time interval of FIG. 3b, it is seen that at one reference frequency cycle after the synchronized enable signal of FIG. 3c is generated, timing generator 300 Node B' and Node A' experience a transition from a logical 1 level to a logical 0 level, respectively, while Node C' continues at a logical 0 level. Thus, transmission gates 160 and 170 are turned off resulting in disconnection of Mode 1 filter 100 from the main synthesizer loop. Immediately subsequent to the level shift but for the purposes of illustration at approximately the same time, Node B of timing generator 300 experiences a transition from a logical 0 state to a logical 1 state as shown in FIG. 3d so that transmission gate 270 of Mode 2 filter 200 is turned on. Simultaneously therewith, at approximately one reference frequency interval after the 0 to 1 logic level shift in the enable signal as shown in FIG. 3c, Node C shifts from a logical 0 to a logical 1 for one reference frequency interval and then returns to a logical 0 state to generate a pulse 500 as shown in FIG. 3e. Thus, transmission gate 280 is turned on for a short period of time to permit the already charged capacitor 220 to precharge capacitor 41 before transmission gate 260 is turned on to fully connected Mode 2 filter 200 to the main synthesizer loop. As soon as the aforementioned precharge pulse 500 is completed, Node A of timing generator 300 experiences a level shift from a logical 0 state to a logical 1 state as seen in FIG. 3f so that transmission gate 260 is turned on while gate 280 is turned off. At this point in time Mode 2 filter 200 is fully connected in the main synthesizer loop between the output of charge pump 70 and the input of VCO 40 so that the synthesizer is operating in Mode 2 on the priority frequency.

To switch from the above described Mode 2 operation on the priority channel frequency back to Mode 1 operation on the main channel frequency, the following sequence occurs. As seen FIG. 3b, at the beginning of the T3 time interval, the priority signal transitions from a logical 1 state indicating Mode 2 priority channel frequency operation to a logical 0 indicating that it is time to again commence Mode 1 operation on the main channel frequency. The priority signal of FIG. 3b is synchronized to the next positive going transition of the $F_R$ reference signal by action of flip-flops 302, 310 and exclusive OR gate 312 which cooperate to generate an enable signal as shown in FIG. 3c. The enable signal exhibits a transition from a logical 1 state to a logical 0 state at the first positive going transition of the $F_R$ reference signal after commencement of the T3 time interval. When the enable signal is provided to the input of divider 60, divider 60 reprograms to divide the VCO output signal provided thereto by the appropriate $N_T$ value for VCO operation on the main channel frequency, that is for Mode 1 operation.

Examining the timing signals generated at Nodes B, C and A during the T3 time interval (immediately below the T3 time interval depicted in FIG. 3b), it is seen that at the same time the enable signal of FIG. 3c transitions from a logical 1 to a logical 0, Nodes B and A of FIG. 3d and 3f, respectively, transition from a logical 1 to a logical 0 state. Thus, transmission gates 260 and 270 are turned off to disconnect Mode 2 filter 200 from the main synthesizer loop. As seen in FIG. 3e, node C continues to exhibit a logical 0 level during the T3 time interval.

At a point in time slightly after Mode 2 filter 200 is disconnected from the main synthesizer loop as described immediately above, Node B' of timing generator 300 transitions from a logical 0 state to a logical 1 state as shown in the timing diagram of FIG. 3g. Thus, transmission gate 170 of Mode 1 filter 100 is turned on.

At essentially the same time as transmission gate 170 is turned, a pulse 510 of one reference frequency cycle length is generated at Node C' as shown in FIG. 3h. Thus, transmission gate 180 is turned on to permit the already charged capacitor 120 to precharge capacitor 41 before transmission gate 160 is turned on to fully reconnect Mode 1 filter 100 to the main synthesizer loop. Immediately after pulse 510 is generated at Node C' of timing generator 300, Node A' of generator 300 transitions from a logical 0 state to a logical 1 state so that transmission gate 160 is turned on while gate 180 is turned off, thus returning synthesizer fully to Mode 1 main channel frequency operation.

Switching between filter 100 and filter 200 in the above described manner substantially reduces the amount of time required for VCO 40 to stabilize at the main channel frequency and the priority frequency when switching VCO operation between such frequencies.

FIG. 4 is a representation of the timing signal generated at Node B' of timing generator 300 superimposed on the timing signal generated at Node B of timing generator 300. This representation emphasizes that the signal at Node B' transitions from a logical 1 to a logical 0 before the signal at Node B transitions from a logical 0 to a logical 1. Thus, it is assured that Mode 1 filter 100 turns off before Mode 2 filter 200 turns on. Likewise, Mode 2 filter 200 turns off before Mode 1 filter 100 turns on.

The frequency synthesizer of FIG. 2 continues switching between Mode 1 main channel frequency operation and Mode 2 priority channel frequency operation ad infinitum in the manner described above.

The foregoing describes a frequency synthesizer capable of main channel frequency and priority channel frequency operation without recharging capacitive elements in the synthesizer loop filter each time a transition is made between the main channel frequency and a priority channel frequency. The frequency synthesizer permits significant reduction of battery powered consumption in portable radios and other applications.

While only certain preferred features of the invention have been shown by way of illustration, many modifications and changes will occur to those skilled in the art. It is, therefore to be understood that the present claims are intended to cover all such modifications and changes as fall within the true spirit of the invention.

What is claimed is:

1. A frequency synthesizer comprising:
reference frequency generating means for generating a reference signal exhibiting a predetermined frequency $F_R$;
phase detector means, having first and second inputs, said first input being coupled to the output of said frequency generating means, for generating a signal exhibiting indicia of the difference in frequency and phase between signals applied to said first and second input thereof;
a first low pass filter switchably coupled to the output of said phase detector means;
a second low pass filter switchably coupled to the output of said phase detector means;
voltage controlled oscillator means, switchably coupled to the respective outputs of said first and second low pass filters, for generating a radio frequency signal at the output thereof which exhibits a frequency which is a function of the voltage applied at the input thereof;
frequency divider means, having an input coupled to the output of said oscillator means, for dividing the signal generated at the output of said oscillator means by a predetermined quality to generate a divided down signal $F_V$ which is provided to the second input of said phase detector means;
switching means, responsive to a timing signal and coupled to said first and second filters, said switching means being operative in a first mode to switchably couple said first filter between the output of said phase detector means and the input of said oscillator means for providing a first output frequency from the voltage controlled oscillator means, said switching means being operative in a second mode to switchably couple said second filter between the input of said phase detector means and the input of said oscillator means for providing a second output frequency from the voltage controlled oscillator means, and
timing signal generating means, coupled to said switching means, for generating a timing signal which instructs said switching means to switch back and forth between said first and second modes at predetermined points in time,
said switching means comprising first and second transmission gates operatively coupled to the input and the output, respectively, of said first low pass filter and further comprising third and fourth transmission gates operatively coupled to the input and the output, respectively, of said second low pass filter,
said timing signal generating means, generating a timing signal to actuate said second gate prior to actuating said first gate when switching to said first low pass filter, and generating a timing signal to actuate said fourth gate prior to actuating said third gate when switching to said second low pass filter, whereby the output of the selectively coupled low pass filter is first selectively coupled to the voltage controlled oscillator means prior to selectively coupling the low pass filter to the phase detector means.

2. The frequency synthesizer of claim 1 wherein the first low pass filter includes a first capacitor means and the switching means includes a transmission fifth gate for selectively coupling the capacitor means directly to the output of the first low pass filter,
the second low pass filter includes a second capacitor means and the switching means includes a transmission sixth gate for selectively coupling the second capacitor means directly to the output of the second low pass filter, and
the timing signal generating means providing signal to momentarily actuate the fifth gate on when the second gate is on but prior to actuating the first gate on, and providing a signal to momentarily actuate the sixth gate on when the fourth gate is on but prior to actuating the third gate on.

3. A frequency synthesizer comprising: reference frequency generating means for generating a reference signal exhibiting a predetermined frequency $F_R$;
phase detector means, having first and second inputs, said first input being coupled to the output of said frequency generating means, for generating a signal exhibiting indicia of the difference in frequency and phase between signals applied to said first and second input thereof;

a plurality of low pass filters switchably individually coupled to the output of said phase detector means;

voltage controlled oscillator means, switchably coupled to the respective outputs of said plurality of low pass filters, for generating a radio frequency signal at the output thereof which exhibits a frequency which is a function of the voltage applied at the input thereof;

frequency divider means, having an input coupled to the output of said oscillator means, for dividing the signal generated at the output of said oscillator means by a predetermined quality to generate a divided down signal $F_V$ which is provided to the second input of said phase detector means;

switching means, responsive to a timing signal and coupled to said low pass filters, said switching means being operative in a first mode to switchably couple a first of said filter between the output of said phase detector means and the input of said oscillator means for providing a first output frequency from the voltage controlled oscillator means, said switching means being operative in a second mode to switchably couple a second of said filters between the input of said phase detector means and the input of said oscillator means for providing a second output frequency from the voltage controlled oscillator means, and timing signal generating means, coupled to said switching means, for generating a timing signal which instructs said switching means to switch to said first and second modes at preselected points in time, said timing signal generating means generating timing signals to actuate said switching means to connect the output of the selected low pass filter to the voltage controlled oscillator means prior to connecting the input of the selected low pass filter to the phase detector means.

4. The frequency synthesizer of claim 3 wherein each of the low pass filter includes a capacitor means, and the timing signal generating means providing a signal to momentarily actuate the switching means when the output of the selectively coupled low pass filter is connected to the voltage controlled oscillator means to momentarily connect said capacitor means of the coupled low pass filter directly to the output of said filter.

5. A frequency synthesizer comprising:

reference frequency generating means for generating a reference signal exhibiting a predetermined frequency $F_R$;

phase detector means, having first and second inputs, said first input being coupled to the output of said frequency generating means, for generating a signal exhibiting indicia of the difference in frequency and phase between signal applied to said first and second input thereof;

a plurality of low pass filters switchably coupled to the output of said phase detector means, each of said filters including a capacitor means;

voltage controlled oscillator means, switchably coupled to the respective outputs of said plurality of low pass filters, for generating a radio frequency signal at the output thereof which exhibits a frequency which is a function of the voltage applied at the input thereof;

frequency divider means, having an input coupled to the output of said oscillator means, for dividing the signal generated at the output of said oscillator means by a predetermined quality to generate a divided down signal $F_V$ which is provided to the second input of said phase detector means;

switching means, responsive to a timing signal and coupled to said plurality of low pass filters, said switching means being operative in a first mode to switchably couple a first of said filters between the output of said phase detector means and the input of said oscillator means for providing a first output frequency from the voltage controlled oscillator means, said switching means being operative in a second mode to switchably couple a second of said filter between the input of said phase detector means and the input of said oscillator means for providing a second output frequency from the voltage controlled oscillator means, and timing signal generating means, coupled to said switching means, for generating a timing signal which instructs said switching means to switch to said first and second modes at preselected points in time, the timing signal generating means provides a signal to momentarily actuate the switching means when the output of the selectively coupled low pass filter is connected to the voltage controlled oscillator means to momentarily connect the capacitor means of the coupled low pass filter directly to the output of said filter.

* * * * *